United States Patent
Choi et al.

(10) Patent No.: US 8,530,349 B2
(45) Date of Patent: Sep. 10, 2013

(54) METHODS FOR FABRICATING SEMICONDUCTOR DEVICES INCLUDING A SEED GENERATION ACCELERATING LAYER

(75) Inventors: Jinwoo Choi, Hwaseong-si (KR); Geun Hee Jeong, Suwon-si (KR); Tae-Yeol Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

(21) Appl. No.: 13/077,463

(22) Filed: Mar. 31, 2011

(65) Prior Publication Data

US 2011/0256717 A1 Oct. 20, 2011

(30) Foreign Application Priority Data

Apr. 19, 2010 (KR) .................. 10-2010-0035978

(51) Int. Cl.
*H01L 21/44* (2006.01)
(52) U.S. Cl.
USPC ........................................ 438/653; 438/674
(58) Field of Classification Search
None
See application file for complete search history.

(56) References Cited

U.S. PATENT DOCUMENTS

| | | | |
|---|---|---|---|
| 5,686,355 A | 11/1997 | Sumi et al. | |
| 5,688,718 A * | 11/1997 | Shue | 438/627 |
| 6,306,756 B1 * | 10/2001 | Hasunuma et al. | 438/632 |
| 2002/0076929 A1 * | 6/2002 | Lu et al. | 438/687 |
| 2008/0136040 A1 | 6/2008 | Park et al. | |
| 2009/0087585 A1 * | 4/2009 | Lee et al. | 427/576 |

FOREIGN PATENT DOCUMENTS

| | | |
|---|---|---|
| JP | 08-124876 | 5/1996 |
| JP | 2005-129831 | 5/2005 |
| JP | 2008-147675 | 6/2008 |
| KR | 10-0402547 | 3/2004 |
| KR | 1020060058583 A | 5/2006 |
| KR | 100806128 B1 | 2/2008 |
| KR | 1020080020061 A | 3/2008 |
| KR | 1020080067177 A | 7/2008 |

OTHER PUBLICATIONS

M.S. Marangon et al. "Nucleation and growth of CVD-W on TiN studied by X-ray fluorescence spectrometry" Applied Surface Science 91 (1995) 157-161.

* cited by examiner

*Primary Examiner* — Scott B Geyer
(74) *Attorney, Agent, or Firm* — Myers Bigel Sibley & Sajovec, PA

(57) ABSTRACT

Provided are semiconductor devices and methods for fabricating the same. A method for fabricating a semiconductor device includes: forming an interlayer dielectric layer including an opening in which a lower conductive layer is exposed; forming a barrier layer on the interlayer dielectric layer and on the lower conductive layer the opening; forming an anti-seed generation region on a surface of the barrier layer which is provided on a top surface of the interlayer dielectric layer and an upper sidewall of the opening; and filling the opening with conductive material to form a conductive layer.

12 Claims, 20 Drawing Sheets

METHODS FOR FABRICATING SEMICONDUCTOR DEVICES INCLUDING A SEED GENERATION ACCELERATING LAYER

CROSS-REFERENCE TO RELATED APPLICATION

This U.S. non-provisional patent application claims priority under 35 U.S.C. §119 to Korean Patent Application No. 10-2010-0035978, filed on Apr. 19, 2010, the entire contents of which are hereby incorporated by reference.

BACKGROUND

The present inventive concept relates to semiconductor devices and methods for fabricating the same, and, more particularly, to semiconductor devices including an opening filled with a conductive layer and methods for fabricating the same.

Semiconductor devices have advantages of lightness, miniaturization, multifunction and/or low costs, and are widely used in a variety of electronic industries. Memory devices for storing data, logic devices for processing data, and/or hybrid devices capable of simultaneously performing a variety of functions are examples of semiconductor devices used in industry.

As the electronics industry is generally highly advanced, demand has increased for high integration of semiconductor devices. In a deposition process of a conductive material on a fine pattern for forming a conductive layer, however, several problems may occur, which are caused by an insufficient process margin. Thus, it may become more difficult to form a semiconductor device. In addition, demand for high speed operation of semiconductor devices has also increased with the advancement of the electronic industry. Thus, much research has gone into meeting the demands for high integration and/or the high speed operation of semiconductor devices.

SUMMARY

Embodiments of the inventive concept may provide semiconductor devices with improved electrical characteristics and methods for fabricating the same.

Embodiments of the inventive concept may further provide semiconductor devices that provide high integration and methods for fabricating the same.

Embodiments of the inventive concept may provide methods for fabricating a semiconductor device, including: forming an interlayer dielectric layer including a opening in which a lower conductive layer is exposed; forming a barrier layer on the interlayer dielectric layer and on the lower conductive layer in the opening; forming an anti-seed generation region on a surface of the barrier layer which is provided on a top surface of the interlayer dielectric layer and an upper sidewall of the opening; and filling the opening with conductive material to form a conductive layer.

In some embodiments, before the forming of the anti-seed generation region, the methods may further include flowing a boron containing gas on the surface of the barrier layer to form a seed generation accelerating layer.

In other embodiments, the forming of the anti-seed generation region may include performing an ion implantation process, a plasma treatment and/or a light source treatment.

In still other embodiments, the ion implantation process may include an oxygen ion implantation process or a pre-amorphization ion implantation using germanium or silicon.

In even other embodiments, the plasma treatment may use a gas comprising argon, hydrogen, nitrogen, oxygen, nitrogen oxide and/or ammonia.

In yet other embodiments, the light source treatment may use a laser source or UV (ultra violet) light as the light source.

In further embodiments, the light source treatment may include providing the light source at an oblique angle with respect to the top surface of the interlayer dielectric layer.

In still further embodiments, the opening may be formed into a hole shape or a groove shape.

In even further embodiments, the barrier layer comprises titanium, tantalum, cobalt, titanium nitride, tantalum nitride and/or cobalt nitride.

In yet further embodiments, the forming of the barrier layer may be performed by a chemical vapor deposition.

In other embodiments of the inventive concept, the farming of the conductive layer may be performed by a chemical vapor deposition.

In still other embodiments of the inventive concept, the forming of the conductive layer may include depositing aluminum and/or tungsten.

In even other embodiments of the inventive concept, the forming of the conductive layer may include sequentially forming a first conductive layer and a second conductive layer.

In yet other embodiments of the inventive concept, the first conductive layer and the second conductive layer may be respectively formed in a chemical vapor deposition or a physical vapor deposition.

In further embodiments of the inventive concept, the first conductive layer and the second conductive layer may be respectively formed of tungsten or aluminum.

Embodiments of the inventive concept provide semiconductor devices including: a substrate including a lower conductive layer; an interlayer dielectric layer including a opening in which the substrate is exposed; a barrier layer disposed on the interlayer dielectric layer and the opening; an anti-seed generation layer disposed on an upper sidewall of the barrier layer on an upper sidewall in the opening and on a top surface of the interlayer dielectric layer; a seed generation accelerating layer disposed on a lower sidewall of the barrier layer in the opening and a bottom of the opening, wherein boron content is higher in the seed generation accelerating layer than in the interlayer dielectric layer.

In some embodiments of the inventive concept, a content of germanium or silicon may be higher in the anti-seed generation layer than in the barrier layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1:
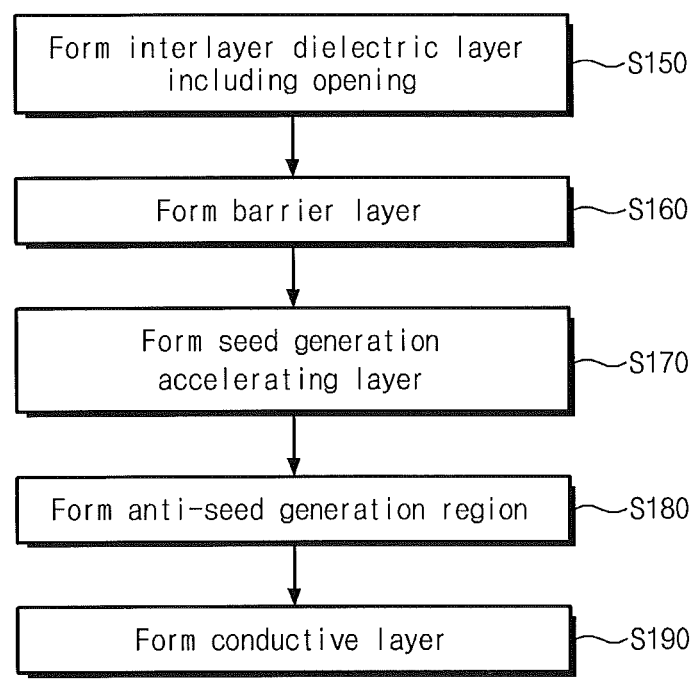
FIG. 1 is a flow chart illustrating a method for fabricating a semiconductor device according to embodiments of the inventive concept.

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout this description. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments of the inventive concept only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the inventive concept are described herein with reference to cross-sectional illustrations that are schematic illustrations of idealized example embodiments of the inventive concept (and intermediate structures). As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the inventive concept will be described in detail with reference to the accompanying drawings.

FIG. 1 is a flow chart illustrating a method for fabricating a semiconductor device according to some embodiments of the inventive concept; FIGS. 2 through 6 are cross-sectional views illustrating a structure of a semiconductor device and a method of forming the same according to an embodiment of the inventive concept; and FIG. 7 is a graph illustrating a change of deposition rate for a conductive layer in forming a seed generation accelerating layer.

Figure 2:
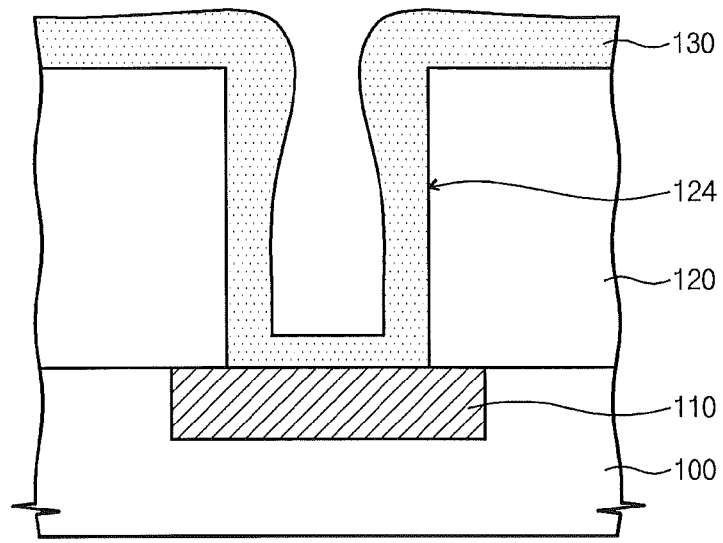
FIGS. 2 through 6 are cross-sectional views illustrating a method and a structure of a semiconductor device according to embodiments of the inventive concept.

Referring to FIGS. 1 and 2, an interlayer dielectric layer 120 may be formed on a substrate 100 including a lower conductive layer 110 (block S150). The interlayer dielectric layer 120 may include an opening 124 in which the lower dielectric layer 120 is exposed. The lower conductive layer 110 may be formed into a line shaped or hole shaped structure. The lower conductive layer 110 may be formed of tungsten, aluminum, copper or other metals. The substrate 100 may include a semiconductor substrate, and the lower conductive layer 110 may be a conductive layer, which is disposed on a dielectric layer on the semiconductor substrate, or an impurity region in which impurities are doped in the semiconductor substrate.

The interlayer dielectric layer 120 may be a single layer or multiple layers. The interlayer dielectric layer 120 may be formed in a chemical vapor deposition. If the lower conductive layer 110 is formed of copper, the interlayer dielectric layer may be formed of dual layers, which include sequentially stacked a barrier insulating layer and an oxide layer. For example, the barrier insulating layer may be formed of a nitride layer and/or an oxynitride layer.

The opening 124 may be formed into a hole shaped or a groove shaped structure. The forming of the opening 124 may include forming an etch mask layer, patterning the etch mask layer, and etching the interlayer dielectric layer 120 exposed by the etch mask layer to expose lower conductive layer 110.

A barrier layer 130 may be formed in conformal fashion on the interlayer dielectric layer 120 and the opening 124 (block S160). The barrier layer 130 may be formed in a chemical vapor deposition, and formed of a layer or at least two layers selected from titanium, tantalum, cobalt, titanium nitride, tantalum nitride and cobalt nitride. If the barrier layer 130 is formed of titanium and titanium nitride, the titanium and the titanium nitride may be formed in a batch process.

Figure 3:
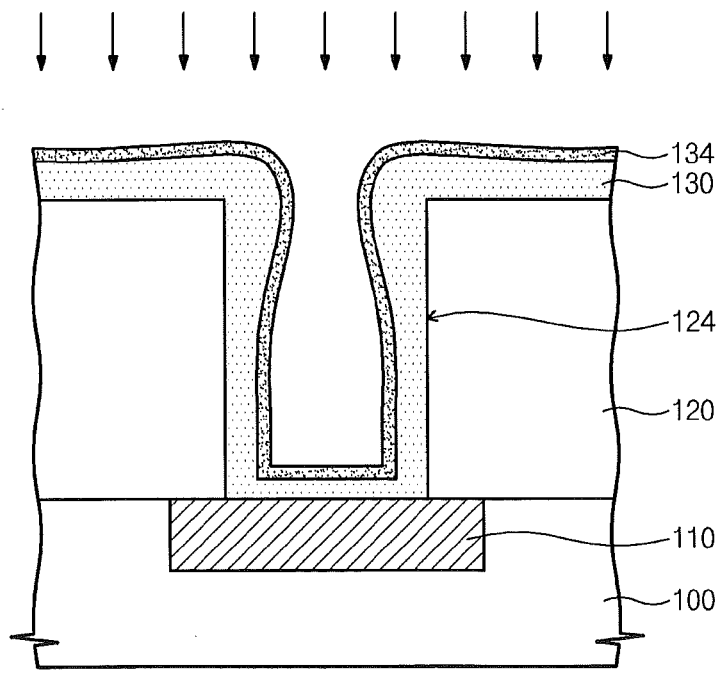

Referring to FIGS. 1 and 3, a seed generation accelerating layer 134 may be formed on the barrier layer 130 (block S170). The seed generation accelerating layer 134 may be formed in a process in which a boron containing gas, such as $B_2H_6$ is flowed. For example, the forming of the seed generation accelerating layer 134 may be performed by flowing $B_2H_6$ at a rate of about 100-1000 sccm at about 5~50 mTorr and about 200~250° C.

Referring to FIG. 7, the axis of ordinate represents change of deposition thickness with cycle times of the tungsten deposition. To verify whether the surface treatment for the barrier layer using $B_2H_6$ gas affects the generation rate of the tungsten seed, the deposition thickness by cycle times of the tungsten deposition were measured after being $B_2H_6$ treated or not. In the case that the seed generation accelerating layer was formed using $B_2H_6$, it can be verified that tungsten was deposited without delay in seed generation at the early stage of the tungsten deposition. Further, after 10 tungsten deposition cycles, the tungsten thickness was determined to be 20 Å more in the case of being $B_2H_6$ treated than untreated. Since Gibbs free energy on the surface becomes lower due to boron deposition on the surface of the barrier layer and reactivity during the deposition process of the conductive layer increases, the boron containing gas treatment accelerates seed generation of the conductive layer.

Figure 4:
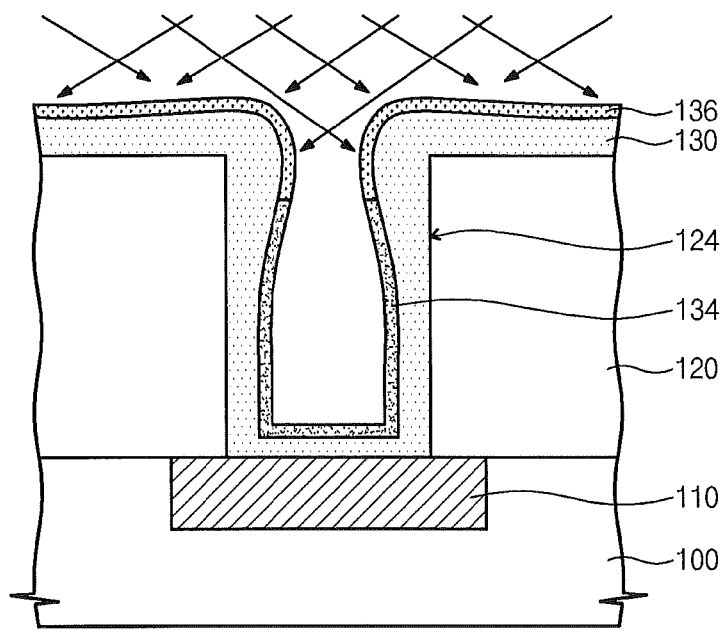

Referring to FIGS. 1 and 4, an anti-seed generation region 136 may be formed at the surface of the barrier layer 130 on the top surface of the interlayer dielectric layer 120 and the upper sidewall of the opening 124 (block S180). Thus, the seed generation accelerating layer 134 on the top surface of the interlayer dielectric layer 120 and the upper sidewall of the opening 124 is changed into the anti-seed generation region thereby exposing the seed generation accelerating layer 134 on the bottom and the lower sidewall of the opening 124. The forming of the anti-seed generation region 136 may use at least one of an ion implantation process, a plasma treatment, and light source treatment.

The ion implantation process may be a pre-amorphization implant using germanium and/or silicon, or an oxygen implant process. The ion implantation process may raise the Gibbs free energy of the barrier layer surface to reduce the reactivity in the conductive layer deposition thereby restraining the seed generation.

The plasma treatment may use at least one of argon, hydrogen, nitrogen, oxygen, nitrogen oxide and ammonia. The plasma treatment may be performed in-situ with the conductive layer deposition.

The light source treatment may use a laser source and/or a UV light. The laser source and/or the UV light may raise the Gibbs free energy of the barrier layer surface to reduce the reactivity in the conductive layer deposition thereby restraining the seed generation. In the light source treatment, the light source may be provided at a predetermined oblique angle with respect to the top surface of the interlayer dielectric layer.

Figure 5:
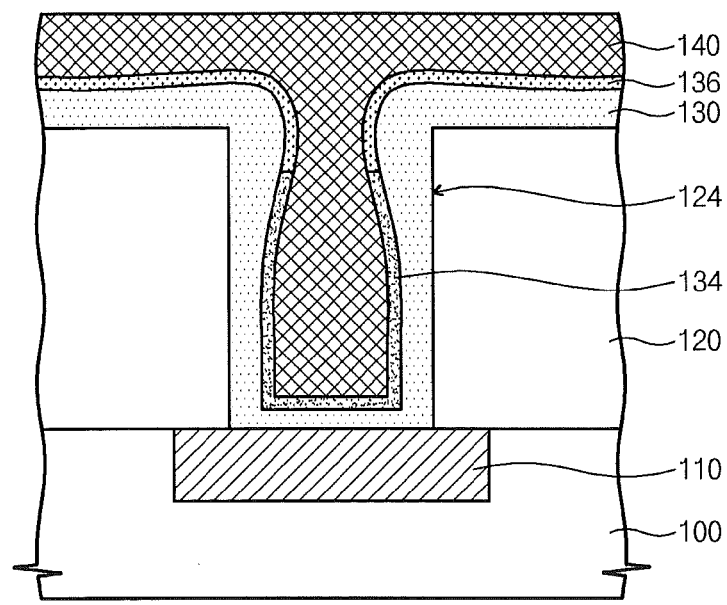

Referring to FIGS. 1 and 5, the opening 124 may be filled with conductive material to form a conductive layer 140 (block S190). The conductive layer 140 may be formed by a chemical mechanical deposition. The conductive layer 140 may include tungsten and/or aluminum. The deposition rate of the conductive layer is more accelerated on the bottom and the lower sidewall of the opening 124 than on the upper sidewall of the opening 124 and the interlayer dielectric layer 120 because the seed generation accelerating layer 134 is formed on the bottom and the lower sidewall of the opening 124 and the anti-seed generation layer 136 is formed on the upper sidewall of the opening and the interlayer dielectric layer 120. Thus, a void can be prevented from forming in the opening 124.

Figure 6:
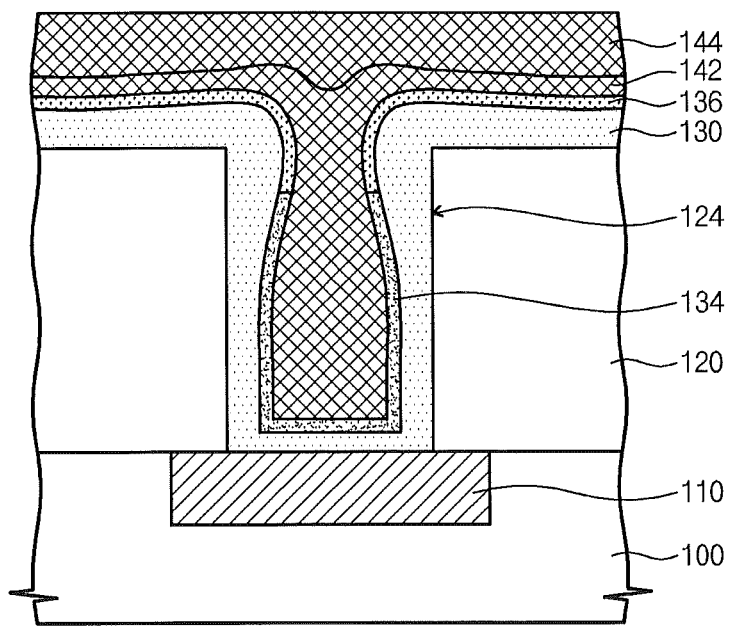
Figure 7:
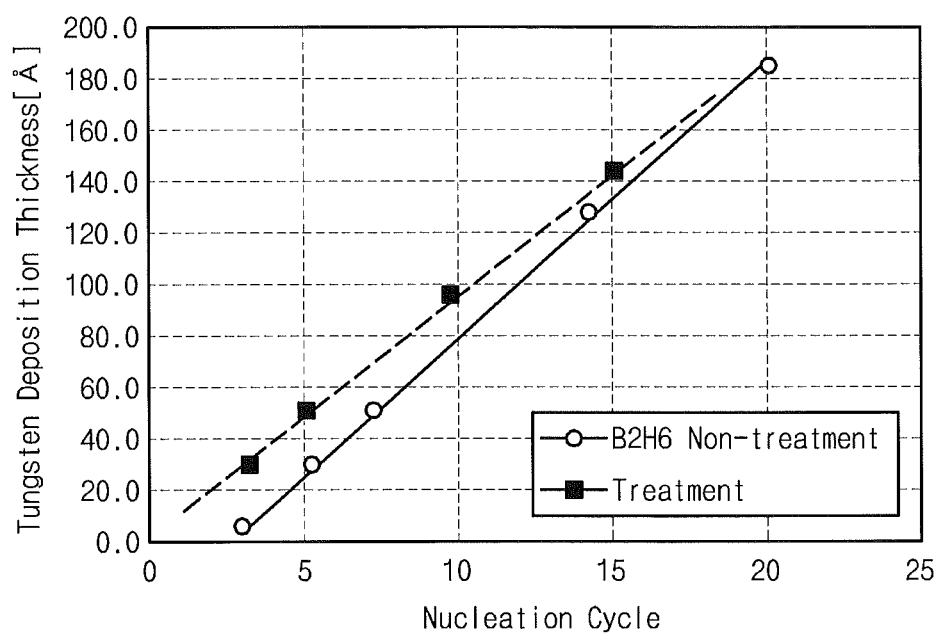
FIG. 7 is a graph illustrating a change of deposition rate for a conductive layer while forming a seed generation accelerating layer according to embodiments of the inventive concept.

Referring to FIG. 6, the conductive layer 140 may be formed to stack a first conductive layer 142 and a second conductive layer 144, successively. The first conductive layer 142 and the second conductive layer 144 may be the same conductive material, for example, the first conductive layer 142 and the second conductive layer 144 may include tungsten and/or aluminum. The first conductive layer 142 may be formed in a chemical vapor deposition and the second conductive layer 144 may be formed in a physical deposition.

A semiconductor device according to an embodiment of the inventive concept will be described.

Referring to FIG. 5, the interlayer dielectric layer 120 may be formed on the substrate 100 which includes the lower conductive layer 110. The lower conductive layer 110 is exposed in the opening 124. The lower conductive layer 110 may be formed into a line shaped structure or a hole shaped structure, and may include tungsten, aluminum and/or copper. The substrate 100 may include a semiconductor substrate, and the lower conductive layer 110 may be a conductive layer, which is disposed on a dielectric layer. The lower conductive layer 110 may be a doped region in the semiconductor substrate.

The interlayer dielectric layer may be a single layer or a multilayer. When the lower conductive layer 110 is formed of copper, the interlayer dielectric layer 120 may include a barrier insulating layer and an oxide layer, which are sequentially stacked.

The opening 124 may be formed into a hole shape structure or a groove structure.

A barrier layer 130 may be disposed on the interlayer dielectric layer 120 and the opening 124. The barrier layer 130 may include at least one of titanium, tantalum, cobalt, titanium nitride, tantalum nitride and cobalt nitride.

The anti-seed generation region 136 may be formed in the barrier layer on the upper sidewall of the opening 124 and the interlayer dielectric layer 120. The anti-seed generation region 136 has a Gibbs free energy higher than that of the barrier layer 130. The anti-seed generation region 136 may have content of germanium and/or silicon higher than that of the barrier layer.

The seed generation accelerating layer 134 may be disposed in the barrier layer 130 on the lower sidewall and the bottom of the opening 124. The seed generation accelerating layer 134 has a Gibbs free energy lower than that of the barrier layer 130. The seed generation accelerating layer 134 may have a content of boron higher than that of the barrier layer 130.

The conductive layer 140 may be disposed in the opening 124 as well as on the anti-seed generation region 136. The conductive layer 140 may include aluminum and/or tungsten.

Referring to FIG. 6, the conductive layer 140 may be a double layer, which includes the first conductive layer 142 and the second conductive layer 144. The first and the second conductive layer 142 and 144 may be the same conductive material for example tungsten and/or aluminum.

A method for fabricating a nonvolatile memory device having a conductive layer, which fills an opening will be described.

FIGS. 8 through 13 are cross-sectional views illustrating a method for fabricating a nonvolatile memory device according to an embodiment of the inventive concept.

Figure 8:
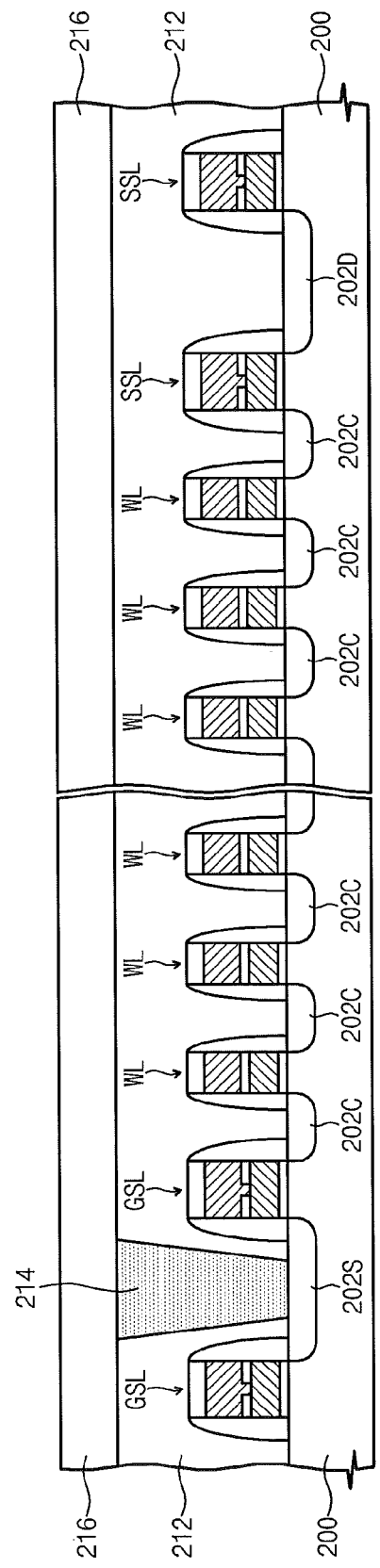
FIGS. 8 through 13 are cross-sectional views illustrating methods for fabricating a nonvolatile memory device according to embodiments of the inventive concept.

Referring to FIG. 8, a device isolation layer may be formed on a semiconductor substrate 200 to define active regions. The active regions may be arranged in parallel. String selection lines SSL, ground selection lines GSL, and a plurality of word lines WL may be formed on the semiconductor substrate 200. The string selection lines SSL and the ground selection lines GSL may cross over the active regions in parallel, and the word lines WL may cross over the active regions between the string selection lines SSL and the ground selection lines GSL. The string selection lines SSL may include a gate insulating layer and a string selection gate line sequentially stacked, and the ground selection line includes a gate insulating layer and a ground selection gate line sequentially stacked. The word line WL may include a tunnel insulating layer, a charge storage pattern, a blocking insulating pattern, and a control gate line sequentially stacked. The charge storage pattern may be formed of doped polysilicon or undoped polysilicon. The charge storage pattern of doped polysilicon may be doped of the same conductivity type as dopants in the substrate. For example, the substrate may be doped with p-type dopants, and the charge storage pattern may be formed of doped polysilicon with p-type dopants. Alternatively, the charge storage pattern may be formed of material having traps of deep energy level, such as silicon nitride and/or nano-crystal. The blocking insulating pattern may be an ONO layer (Oxide-nitride-oxide layer). Alternatively, the blocking insulating pattern may be formed of a high-k dielectric layer having a dielectric constant higher than a dielectric constant of the tunnel insulating layer.

A drain region 202D, cell source/drain regions 202C, and a common source region 202S may be formed between the string selection lines SSL, the word lines WL, and the ground selection lines GSL. The cell source/drain regions 202D may be formed in the active regions at both side of the word lines WL, the drain region 202D may be formed in the active region at a side of the string selection line SSL, and the common source region 202S may be formed in the active region at a side of the ground selection line GSL. The string selection line SSL, the word lines WL, cell source/drain regions 202C, and the ground selection line GSL may be disposed between the drain region 202D and the common source region 202S.

A first interlayer dielectric layer 212 may be formed on the entire surface of the semiconductor substrate 200. The first interlayer dielectric layer 212 may be patterned to form a groove in which the common source region 202s is exposed. The groove may be in parallel with the ground selection lines GSL. A first conductive layer may be formed to fill the groove and planarized until the first interlayer dielectric layer 212 is exposed, thereby forming a common source line 214 which fills the groove. The first conductive layer may be formed of a conductive material, for example, tungsten. The common source line 214 may be in contact with the common source region 202S. A second interlayer dielectric layer 216 may be formed on the entire surface of the semiconductor substrate 200. The second interlayer dielectric layer 216 may cover the common source line 214.

Figure 9:
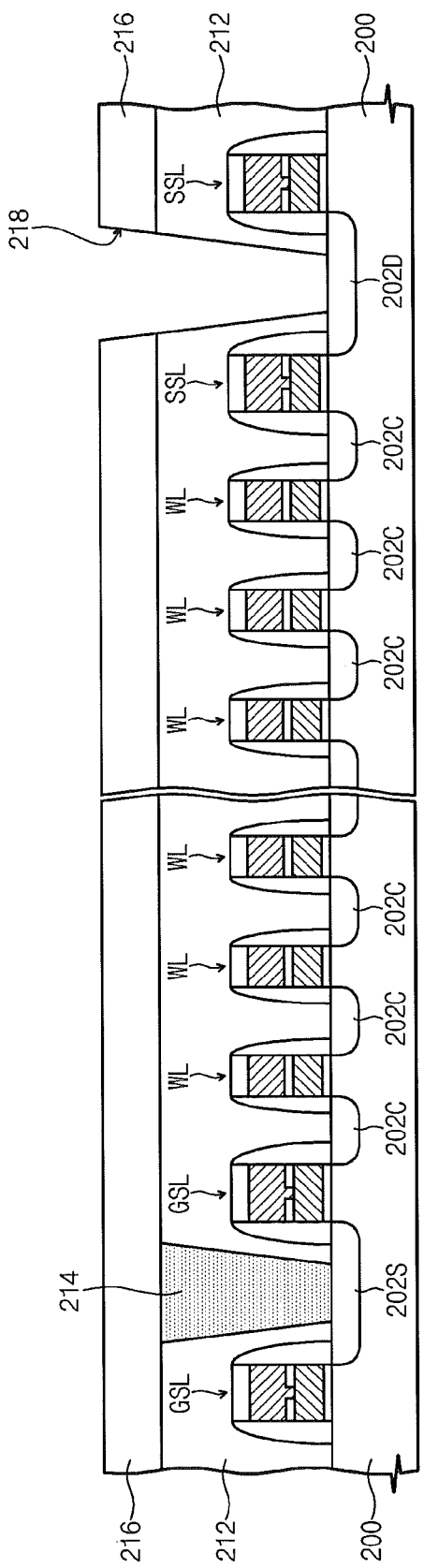

Referring to FIG. 9, an opening 218 penetrating the first interlayer dielectric layer 212 and the second interlayer dielectric layer 216 between the string selection lines SSL may be formed to expose the drain region 202D. The forming of the opening 218 may include forming an etch mask layer, patterning the etch mask layer and etching the first interlayer dielectric layer 212 and the second interlayer dielectric layer 216 using the etch mask layer as an etch mask to expose the drain region 202D.

Figure 10:
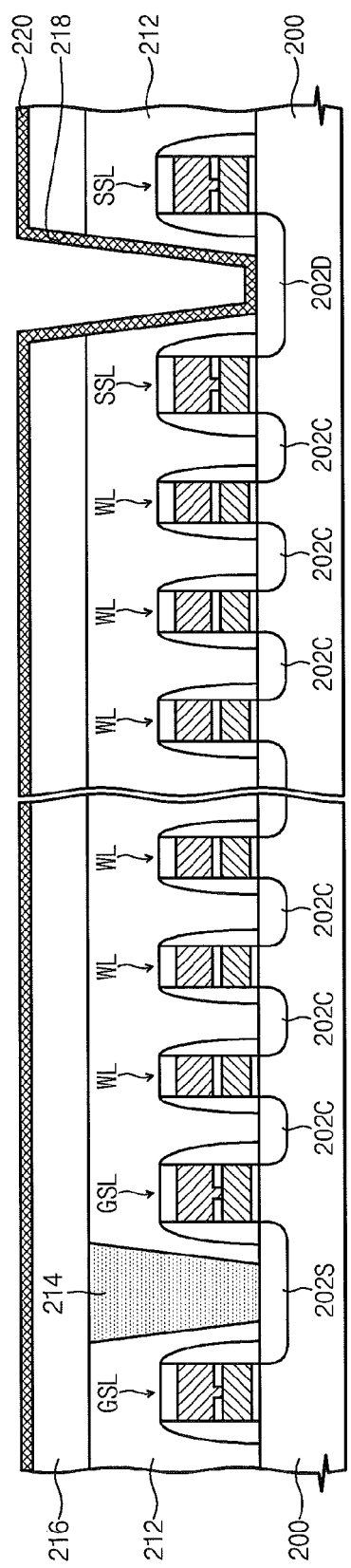

Referring to FIG. 10, a barrier layer 220 may be formed on the interlayer dielectric layer 216 as well as in the opening 218. The barrier layer 220 may be formed in a chemical vapor deposition and be formed of one or at least two layers selected from titanium, tantalum, cobalt, titanium nitride, tantalum nitride and/or cobalt nitride.

Figure 11:
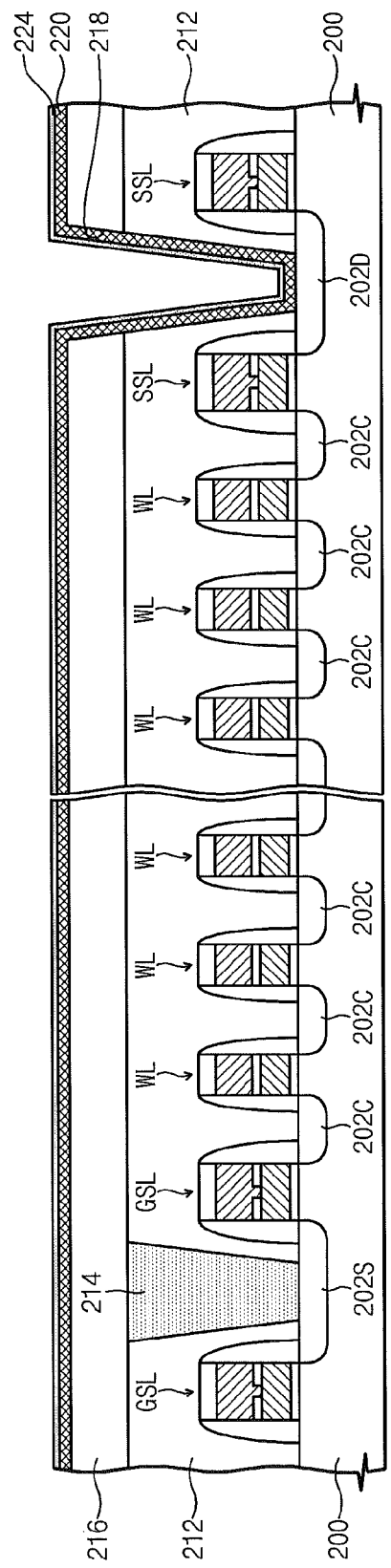

Referring to FIG. 11, a seed generation accelerating layer 224 may be formed at the surface of the barrier layer 220. The seed generation accelerating layer 224 may be formed by a process in which a boron containing gas is flowed, for example, $B_2H_6$ may be flowed. The seed generation accelerating layer 224 may be formed by flowing $B_2H_6$ at a rate of about 100~1000 sccm of at a pressure of about 5-50 mTorr and a temperature of about 200~500° C.

Figure 12:
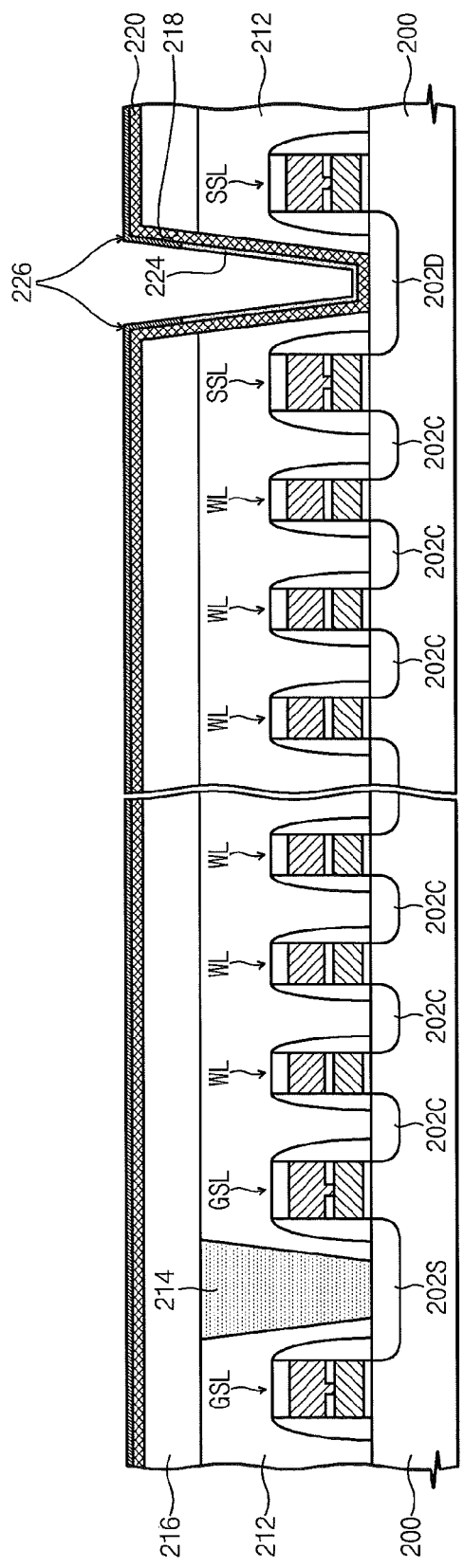

Referring to FIG. 12, an anti-seed generation layer 226 may be formed at the barrier layer 220 on the second interlayer dielectric layer 216 and an upper sidewall of the opening. The seed generation accelerating layer 224 on the bottom and a lower sidewall of the opening 218 remains as is while the seed generating accelerating layer 224 on the second interlayer dielectric layer 216 and the upper sidewall of the opening 218 changes into the anti-seed generating layer. The forming of the anti-seed generating layer 226 may be performed by an ion implantation process, a plasma treatment, and/or a light source treatment.

The ion implantation process may be a pre-amorphization implant and/or an oxygen ion implantation. The ion implantation process raise Gibbs free energy of the barrier layer 220 surface to reduce reactivity in the deposition process of the conductive layer, thereby retraining seed generation.

The plasma treatment may be performed using at least one gas of argon, hydrogen, nitrogen, oxygen, nitrogen oxide and ammonia. The plasma treatment may be performed in-situ with the forming of the conductive layer.

The light source treatment may be performed using a laser source and/or a UV light source. The laser source and/or the UV light source may have a predetermined energy such that the light source treatment may raise Gibbs free energy of the barrier layer 220 surface to reduce reactivity in the deposition process of the conductive layer, thereby restraining seed generation. The light source treatment may be performed by providing the UV light source and/or the laser source at a predetermined oblique angle with respect to the top surface of the interlayer dielectric layer.

Figure 13:
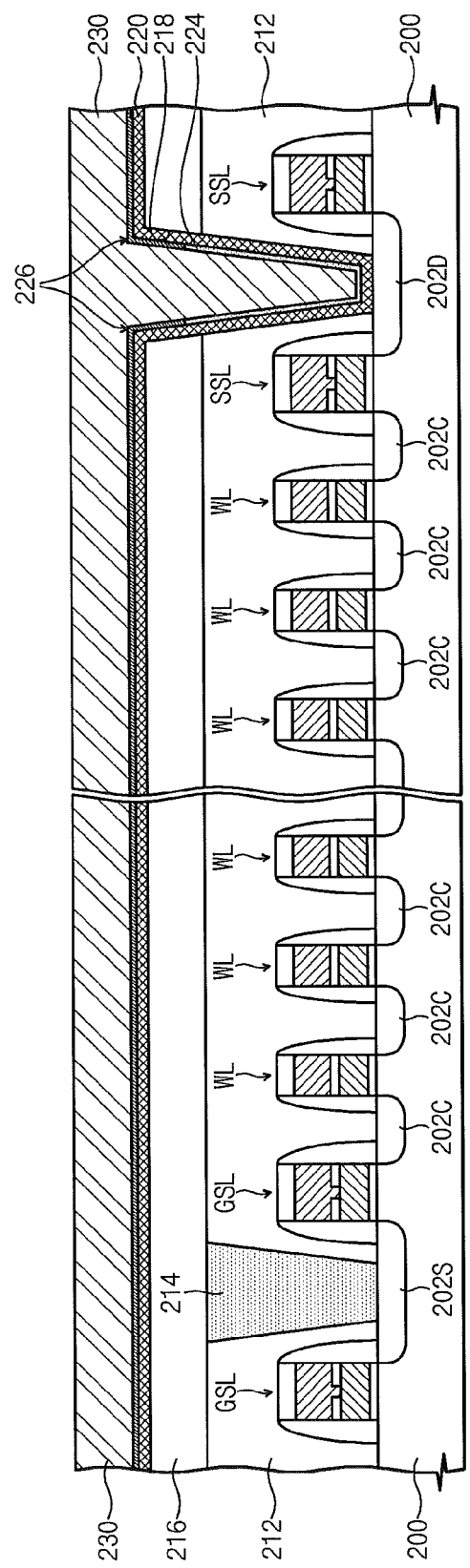

Referring to FIG. 13, a second conductive layer 230 may be formed in the opening 218 and on the anti-seed generation layer 226. The second conductive layer 230 may be formed in a chemical vapor deposition, and include tungsten and/or aluminum.

After forming the second conductive layer 230, the second conductive layer 230 on the second interlayer dielectric layer may be etched and planarized to form a bit line contact.

A method for fabricating a nonvolatile memory device with a bit line contact according to embodiments of the inventive concept has been described. In addition, the common source line 214, a bit line and a metal contact may be formed based on embodiments of the inventive concept.

A method for fabricating a DRAM device with a conductive layer filling an opening according to embodiments of the inventive concept will be described.

FIGS. 14 through 19 are cross-sectional views illustrating a method for fabricating a DRAM device according to some embodiments of the inventive concept.

Figure 14:
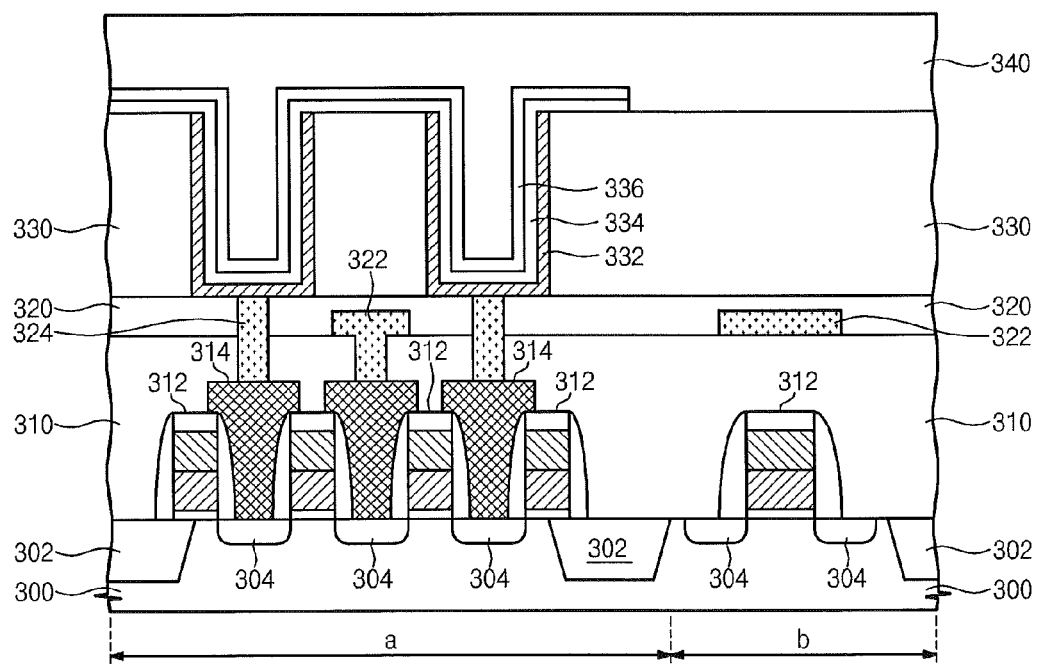
FIGS. 14 through 19 are cross-sectional views illustrating methods for fabricating a DRAM device according to embodiments of the inventive concept.

Referring to FIG. 14, device isolating layer 302 may be formed to define an active region and a field region on the semiconductor substrate 300 with a cell region (a) and a peripheral region (b). Gate electrodes 321 with a spacer may be formed on the semiconductor substrate 300, and an ion implantation process may be performed to form source/drain regions 304 at both sides of the gate electrodes 312. The contact plugs 314 may be self aligned between the gate electrodes 312 on the cell region (a) and then a first interlayer dielectric layer 310 covering contact plugs 314 and the gate electrodes 321 may be formed. A bit line 322 may be patterned on the first interlayer dielectric layer 310, and a second interlayer dielectric layer 320 may be formed to cover the bit line 322. Subsequently, a storage node contact plug 324 may be formed to be in contact with the contact plug 314 through the second interlayer dielectric layer 320 and the first interlayer dielectric layer 310. The storage node contact plug 324 may be formed of doped silicon and/or tungsten. A diffusion barrier layer (not shown) may be further formed on the storage node contact plug.

A third interlayer dielectric layer 330 may be formed on the second interlayer dielectric layer 320 having the storage node contact plug 324.

An opening exposing the storage node contact plug 324 may be formed on the third interlayer dielectric layer 330. A cylindrical capacitor may be formed in the opening to be in contact with the storage node contact plug 324. The cylindrical capacitor may include a lower electrode layer 332, a dielectric layer 334, and an upper electrode layer 336, which are sequentially stacked.

The lower electrode layer 332 may include titanium and titanium nitride. The lower conductive layer 332 may be formed in a chemical vapor deposition. If the dielectric layer is a hafnium oxide ($HfO_2$), the hafnium oxide may be formed by forming a hafnium layer using a chemical vapor deposition and performing an oxide thermal treatment to the hafnium layer. The upper electrode layer 336 may be formed of titanium nitride in a successive process of a chemical vapor deposition and/or a self ionized plasma physical vapor deposition.

A fourth interlayer dielectric layer 340 may be formed on the entirety of the semiconductor device.

Figure 15:
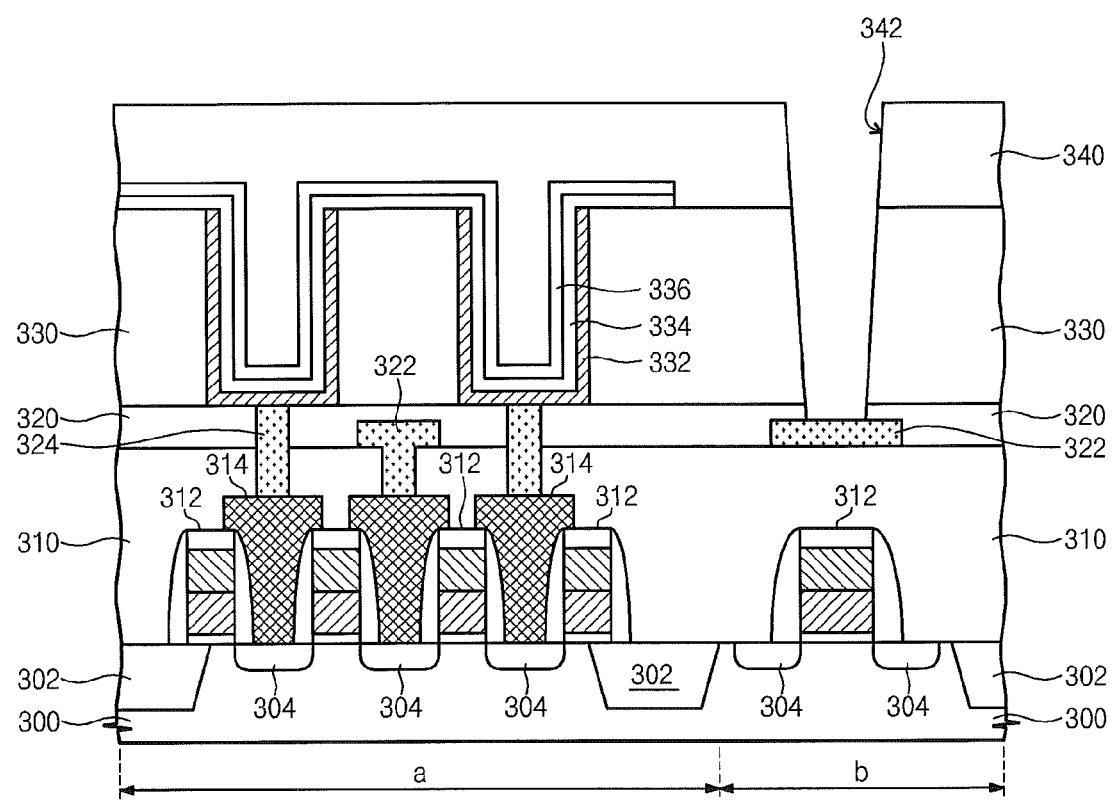

Referring to FIG. 15, the fourth interlayer dielectric layer 340, the third interlayer dielectric layer 330 and the second interlayer dielectric layer 320 on the peripheral region (b) may be etched to form an opening 342 in which the bit line 322 is exposed. The forming of the opening 342 may include forming an etch mask layer, patterning the etch mask layer and etching the fourth interlayer dielectric layer 340, the third interlayer dielectric layer 330, and the second interlayer dielectric layer 320 using the etch mask layer as an etch mask.

Figure 16:
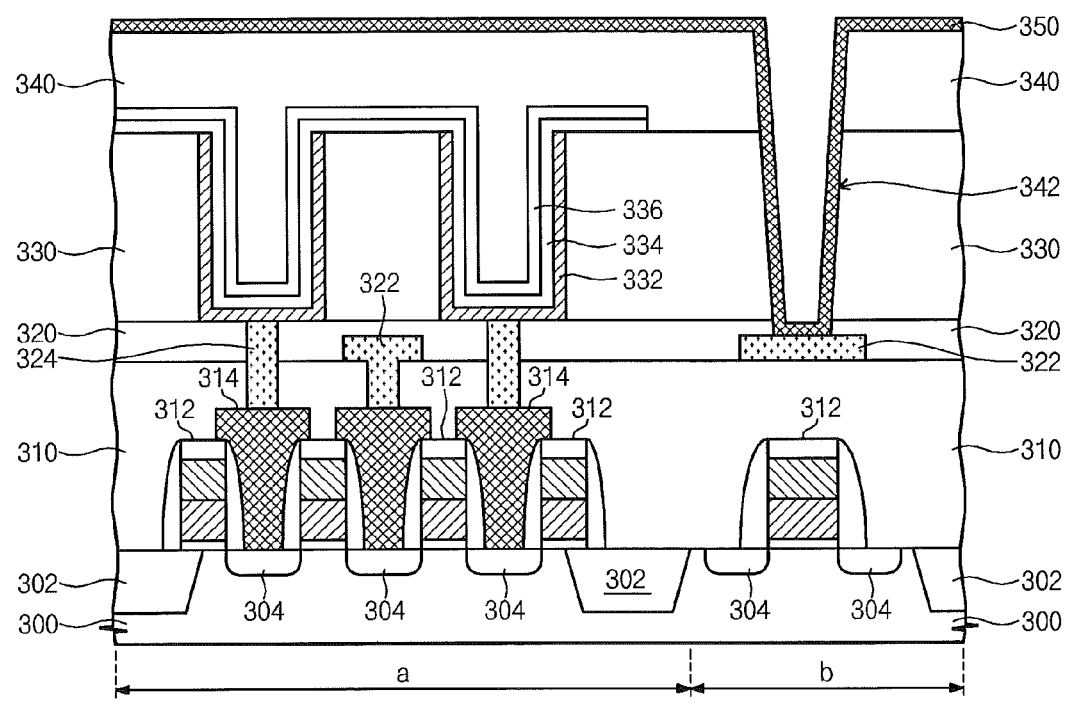

Referring to FIG. 16, a barrier layer 350 may be formed in the opening as well as on the fourth interlayer dielectric layer 340. The barrier layer 350 may be formed in a chemical vapor deposition. The barrier layer 350 may be formed of one or at least two layers of titanium, tantalum, cobalt, titanium nitride, tantalum nitride and/or cobalt nitride.

Figure 17:
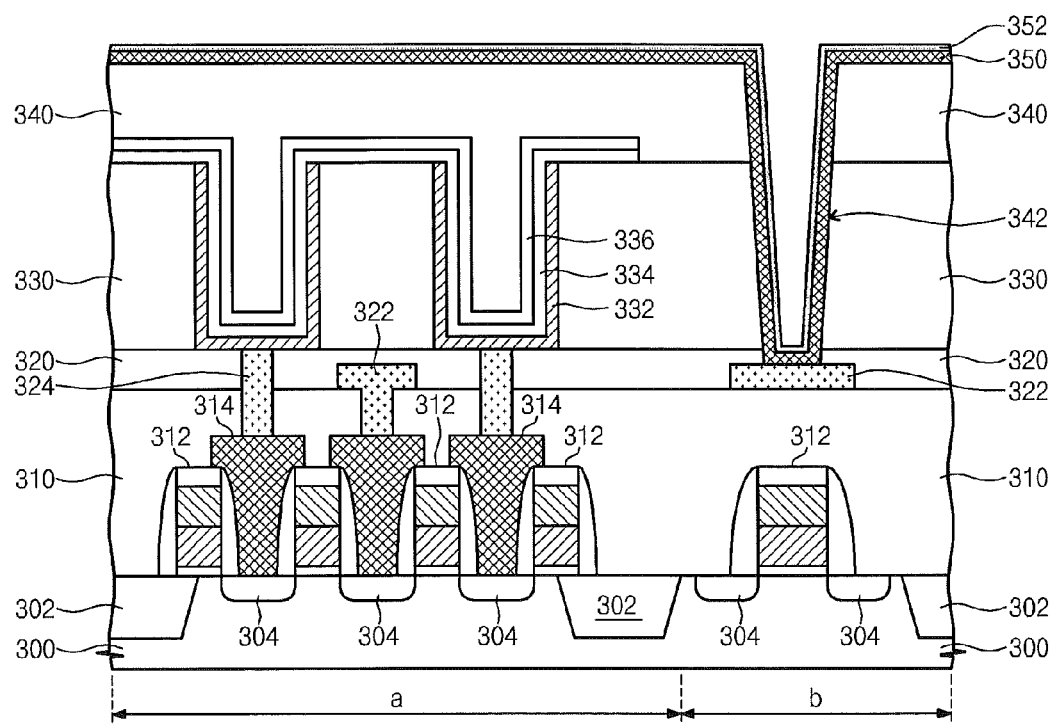

Referring to FIG. 17, a seed generation accelerating layer 352 may be formed at a surface of the barrier layer 350. The seed generation accelerating layer 352 may be formed by a process in which a boron containing gas, such as $B_2H_6$, is flowed. For example, the forming of the seed generation accelerating layer 352 may be performed by providing $B_2H_6$ at a flow rate of about 100~1000 sccm of at a pressure of about 5~10 mTorr and a temperature of about 200~500° C.

Figure 18:
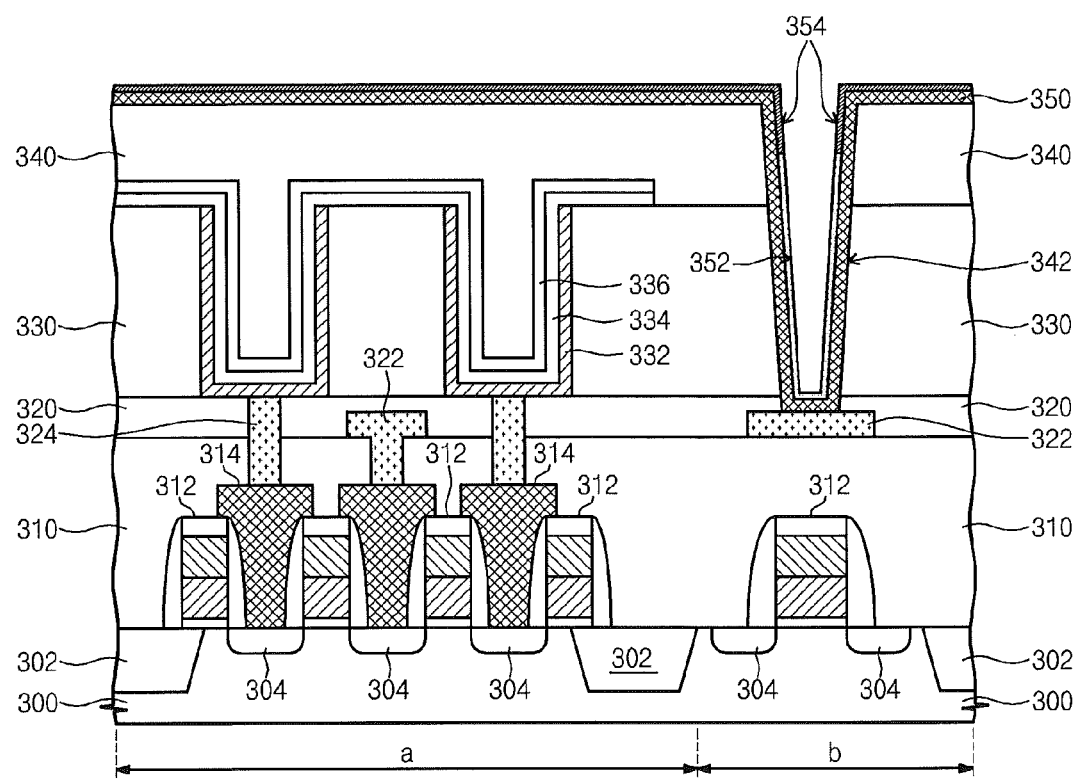

Referring to FIG. 18, an anti-seed generation layer 354 may be formed at a surface of the barrier layer 350 on the fourth interlayer dielectric layer 340 and an upper sidewall of the opening 342. The seed generation accelerating layer 352 on the bottom and a lower sidewall of the opening 342 remains while the seed generation accelerating layer 352 on the fourth interlayer dielectric layer 340 and the upper sidewall of the opening 342 changes into the anti-seed generation layer 354. The forming of the anti-seed generation layer 354 may be performed in at least one of an ion implantation process, a plasma treatment, and/or a light source treatment.

The ion implantation process may be a pre-amorphization implantation using germanium or silicon, or an oxygen ion implantation process. The ion implantation process may raise Gibbs free energy of the barrier layer 350 surface to reduce reactivity in the deposition process of the conductive layer, thereby restraining seed generation.

The plasma treatment may use at least one gas selected from argon, hydrogen, nitrogen, oxygen, nitrogen oxide and/or ammonia. The plasma treatment may be performed in-situ with the process of forming the conductive layer.

The light source treatment may use a laser source and/or a UV light source. The laser source and/or the UV light source has a predetermined energy, such that the light source treatment may raise Gibbs free energy of the barrier layer surface to reduce reactivity in the deposition process of the conductive layer, thereby restraining seed generation.

The light source treatment may provide the UV light and/or the laser light source at a predetermined oblique angle with respect to the top surface of the interlayer dielectric layer.

Figure 19:
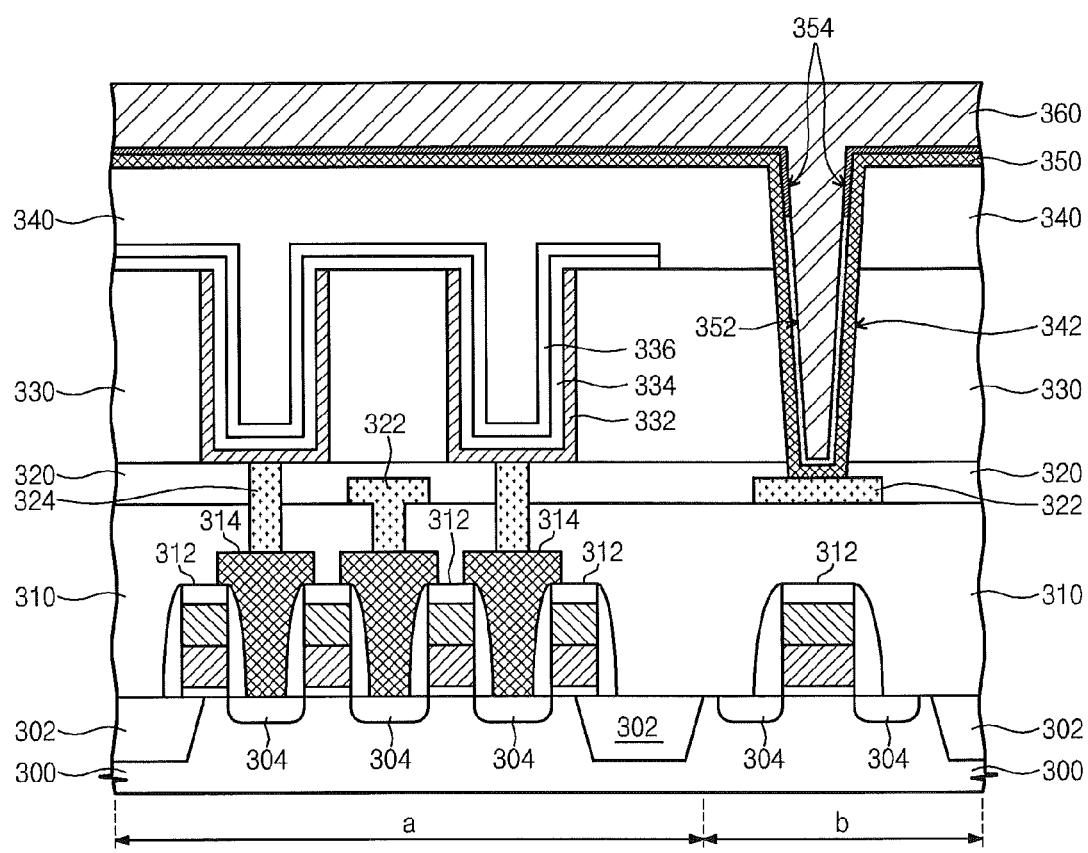

Referring to FIG. 19, a conductive layer 360 may be formed on the anti-seed generation layer 354 as well as in the opening 342. The conductive layer 360 may be formed in a chemical vapor deposition and may include tungsten and/or aluminum.

After forming the conductive layer 360, the conductive layer 360 may be etched and planarized to form a metal contact on the fourth interlayer dielectric layer.

Embodiments of the inventive concept are not limited to methods for fabricating nonvolatile memory devices and DRAM devices. The methods for fabricating semiconductor devices according to embodiments of the inventive concept may be applied to all memory devices including, but not limited to, a logic device, a phase changeable memory device, a ferroelectric memory device, and a NOR type nonvolatile memory device.

Figure 20:
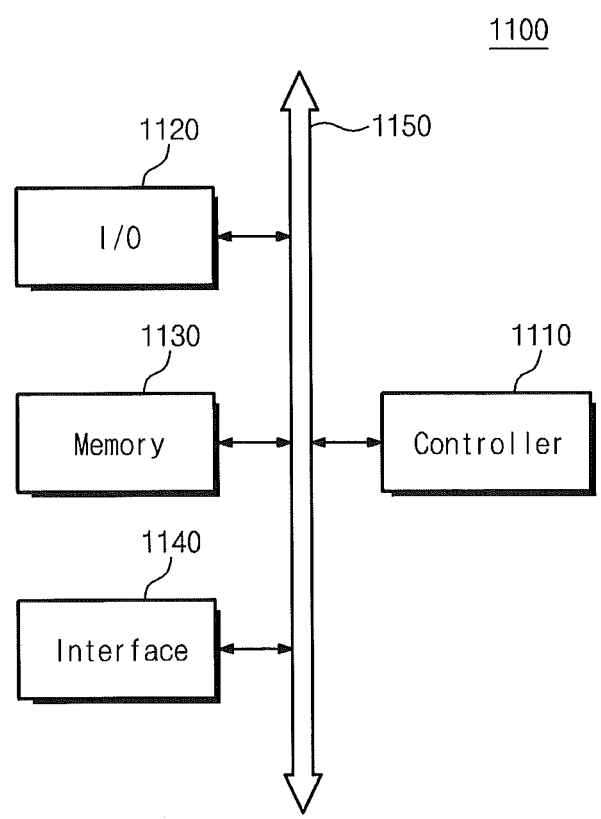
FIG. 20 is a schematic block diagram illustrating a memory system having a semiconductor device according to embodiments of the inventive concept.

FIG. 20 is a schematic block diagram illustrating a memory system having a semiconductor device according to some embodiments of the inventive concept.

Referring to FIG. 20, a memory system 1100 can be applied to a PDA, a portable computer, a web tablet, a wireless phone, a mobile phone, a digital music player, a memory card and/or other devices for transmitting and/or receiving data in a wireless environment.

The memory system 1100 may include a controller 1110, an input/output device 1120, such as a keypad, keyboard and a display, a memory 1130, an interface 1140, and a bus 1150. The memory 1130 and the interface 1140 may interface with each other through the bus 1150.

The controller 1110 may include at least one of a micro processor, a digital signal processor, a micro controller and/or other processing devices.

The memory 1130 may be used to store a command which is carried out by the controller. The input/output device 1120 may receive data or signals from sources external to the system 110 and/or transmit data or signals to destinations external to the system 110. For example, the input/output device 1120 may include a keyboard, a keypad, and/or a display device.

The memory 1130 may include a nonvolatile memory device according to some embodiments of the inventive concept. The memory 1130 may also include another sort of memory, a random accessible memory, and/or other sorts of memories.

The interface 1140 may perform a function of transmitting data to a communication network or receiving data from the network.

Figure 21:
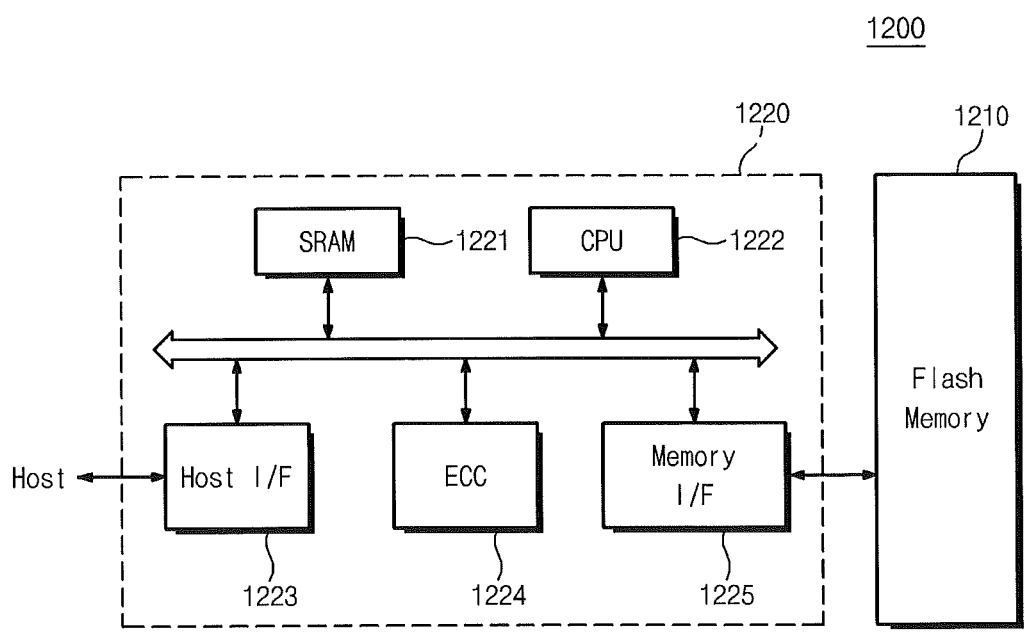
FIG. 21 is a schematic block diagram illustrating a memory card having a semiconductor device according to embodiments of the inventive concept.

FIG. 21 is a schematic block diagram illustrating a memory card having a semiconductor device according to some embodiments of the inventive concept.

Referring to FIG. 21, a memory card 1200 for mass data storage has a nonvolatile memory device 1210, a SRAM 1221, a memory interface 1225, and/or a processing unit 1222. The memory card 1200 may include a memory controller 1220, which controls the interchanging of data between a host and a nonvolatile memory device. The nonvolatile memory device 1210, the SRAM 1221, the memory interface 1225, and the processing unit 1222 may include a semiconductor device according to some embodiments of the inventive concept.

The SRAM 1221 may be used as a driving memory for the processing unit 1222. A host interface 1223 may have a data interchanging protocol of the host connected with the memory card 1200. An error collection code block 1224 may detect and collect errors included in data from the nonvolatile memory device 1210. The memory interface 1225 may interface with the nonvolatile memory device 1210. The processing unit 1222 may perform control operations for interchanging of data with the memory controller 1220. The memory card 1200 may further have a ROM (Read Only Memory) according to some embodiments of the inventive concept. The ROM may store code for interfacing with the host.

The semiconductor device, the memory card, and the memory device, according to some embodiments of the inventive concept, may provide a memory system with relatively high reliability. In particular, a nonvolatile memory device, a logic device, and/or a volatile memory device according to some embodiments of the inventive concept may be provided in a memory system, such as a solid state disk.

Figure 22:
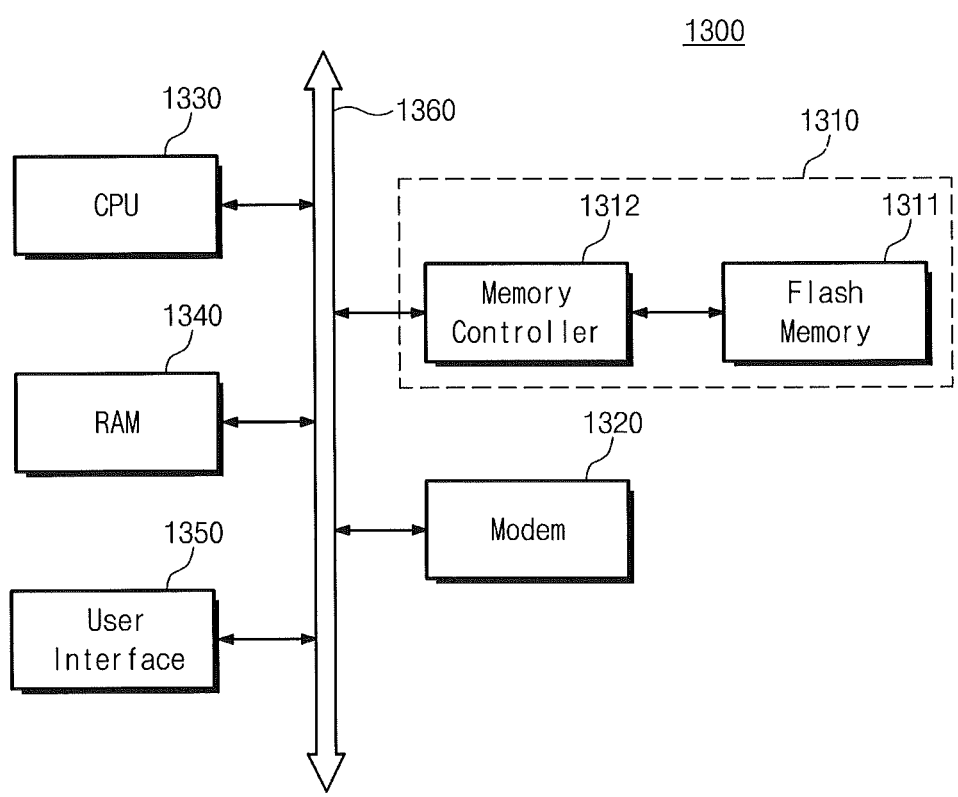
FIG. 22 is a schematic block diagram illustrating an information processing system having a semiconductor device according to embodiments of the inventive concept.

FIG. 22 is a schematic block diagram illustrating an information processing system 1300 having a semiconductor device according to some embodiments of the inventive concept.

Referring to FIG. 22, a flash memory system 1310 may be embedded in an information processing system 1300, such as a mobile appliance or a desktop computer. The information processing system 1300 may include a flash memory system 1310, a modem 1320, a CPU (1330), a RAM 1340, and a user interface 1350 that are electrically connected with a system bus 1360. The CPU 1330 and the RAM 1340 may include a semiconductor device according to some embodiments of the inventive concept. The flash memory system 1310 may be constructed substantially the same as the foregoing memory system and/or flash memory system embodiments described above. The flash memory system 1310 may store data executed by the CPU 1330 or input from the exterior. The flash memory system 1310 may be a solid state disk (SSD), such that the information processing system 1300 can store mass data in the flash memory system 1310 thereby the flash memory system 1310 can reduce a need for a resource for collecting errors due to a reliability improvement. Therefore, the information processing system 1300 can performs high speed data interchanging function. The information processing system 1300 may have an application chipset, a camera imaging processor, and/or input/output devices.

The nonvolatile memory device or memory system according to embodiments of the inventive concept may be formed into a variety of packages. For example, the nonvolatile memory system can be mounted as a PoP (Package on Package), a BGAs (Ball grid arrays), a CSPs (Chip Scale Packages), a PDIP (Plastic Dual In-line Package), a Die in Waffle Pack, a Die in Wafer Form, a COB (Chip On Board), a CERDIP (Ceramic Dual In-line Package), a MQFP (Plastic Metric Quad Flat Pack), a TQFP (Thin Quad Flat Pack), a SOIC(Small Outline), a SSOP (Shrink Small Outline Package), a TSOP (Thin Small Outline), a TQFP (Thin Quad Flat Pack), a SIP (System In Package), a MCP (Multi Chip Package), a WFP (Wafer-level Fabricated Package), a WSP (Wafer-level Processed Stack Package, etc.

According to embodiments of the inventive concept, the deposition rate of the conductive material is relatively slower on the upper sidewall of the opening than on the bottom and lower sidewall of the opening because the seed generation is accelerated at the bottom and lower sidewall of the opening during the formation of the conductive layer by filling the opening with the conductive material. Thus, the formation of a void may be prevented and/or inhibited while the conductive layer is formed thereby improving electric characteristics and reliability of the semiconductor devices.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed:

1. A method for fabricating a semiconductor device, comprising:
    forming an interlayer dielectric layer including an opening in which a lower conductive layer is exposed;
    forming a barrier layer on the interlayer dielectric layer and on the lower conductive layer in the opening;
    forming a seed generation accelerating layer on the barrier layer;
    forming an anti-seed generation region in a portion of the seed generation accelerating layer, which is provided on a top surface of the interlayer dielectric layer and an upper sidewall of the opening; and
    filling the opening with conductive material to form a conductive layer.

2. The method of claim 1, wherein forming the seed generation accelerating layer comprises:
   flowing a boron containing gas on the surface of the barrier layer to form the seed generation accelerating layer.

3. The method of claim 2, wherein the forming the anti-seed generation region comprises performing an ion implantation process, a plasma treatment, and/or a light source treatment.

4. The method of claim 3, wherein the plasma treatment uses a gas comprising argon, hydrogen, nitrogen, oxygen, nitrogen oxide and/or ammonia.

5. The method of claim 1, wherein the opening is formed into a hole shape or a groove shape.

6. The method of claim 1, wherein the barrier layer comprises titanium, tantalum, cobalt, titanium nitride, tantalum nitride and/or cobalt nitride.

7. The method of claim 6, wherein the forming of the barrier layer is performed by a chemical vapor deposition.

8. The method of claim 1, wherein the forming of the conductive layer is performed by a chemical vapor deposition.

9. The method of claim 8, the forming of the conductive layer comprises depositing aluminum and/or tungsten.

10. The method of claim 9, wherein the forming of the conductive layer comprises sequentially forming a first conductive layer and a second conductive layer.

11. The method of claim 10, wherein the first conductive layer and the second conductive layer are respectively formed in a chemical vapor deposition or a physical vapor deposition.

12. The method of claim 11, wherein the first conductive layer and the second conductive layer are respectively formed of tungsten or aluminum.

* * * * *